US011722622B2

(12) United States Patent
Nakazawa

(10) Patent No.: US 11,722,622 B2
(45) Date of Patent: Aug. 8, 2023

(54) PHOTOELECTRIC CONVERSION ELEMENT, READING DEVICE, AND IMAGE PROCESSING APPARATUS

(71) Applicant: Masamoto Nakazawa, Kanagawa (JP)

(72) Inventor: Masamoto Nakazawa, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 17/640,830

(22) PCT Filed: Sep. 18, 2020

(86) PCT No.: PCT/IB2020/058694
§ 371 (c)(1),
(2) Date: Mar. 7, 2022

(87) PCT Pub. No.: WO2021/064501
PCT Pub. Date: Apr. 8, 2021

(65) Prior Publication Data
US 2022/0345584 A1 Oct. 27, 2022

(30) Foreign Application Priority Data

Sep. 30, 2019 (JP) .............................. JP2019-180197

(51) Int. Cl.
H04N 1/00 (2006.01)
H04N 1/23 (2006.01)
H04N 1/191 (2006.01)

(52) U.S. Cl.
CPC ....... *H04N 1/2369* (2013.01); *H04N 1/00822* (2013.01); *H04N 1/1918* (2013.01)

(58) Field of Classification Search
CPC .. H04N 1/1918; H04N 1/031; H04N 9/04553; H04N 5/3692
See application file for complete search history.

(56) References Cited

U.S. PATENT DOCUMENTS 4,862,286 A * 8/1989 Suda ................... H04N 25/63
358/530
5,453,611 A 9/1995 Oozu et al.
(Continued)

FOREIGN PATENT DOCUMENTS

EP 0605898 A1 * 7/1994
EP 0605898 A1 7/1994
(Continued)

OTHER PUBLICATIONS

International Search Report dated Oct. 23, 2020 in PCT/IB2020/058694 filed on Sep. 18, 2020, 9 pages.
(Continued)

*Primary Examiner* — Ted W Barnes
(74) *Attorney, Agent, or Firm* — Xsensus LLP

(57) ABSTRACT

A photoelectric conversion element includes a first pixel array including first light-receiving sections arranged in a direction and a second pixel array including second light-receiving sections arranged in the direction. Each of the first light-receiving sections includes a first pixel configured to receive at least light having a first wavelength inside a visible spectrum and a first pixel circuit configured to transmit a signal from the first pixel to a subsequent stage. Each of the second light-receiving sections includes a second pixel configured to receive at least light having a second wavelength outside the visible spectrum and a second pixel circuit configured to transmit a signal from the second pixel to the subsequent stage. The second pixel circuit is provided in a vicinity of the second pixel.

15 Claims, 14 Drawing Sheets

(56) References Cited

U.S. PATENT DOCUMENTS

| | | | |
|---|---|---|---|
| 5,731,880 A | 3/1998 | Takaragi et al. | |
| 6,094,281 A * | 7/2000 | Nakai | H04N 1/486 |
| | | | 358/530 |
| 6,486,974 B1 * | 11/2002 | Nakai | H04N 1/028 |
| | | | 358/1.9 |
| 2003/0044190 A1 * | 3/2003 | Nakayama | G03G 15/5062 |
| | | | 399/49 |
| 2006/0054787 A1 * | 3/2006 | Olsen | H04N 13/254 |
| | | | 348/E5.037 |
| 2010/0289885 A1 * | 11/2010 | Lu | H04N 23/843 |
| | | | 348/61 |
| 2014/0028804 A1 * | 1/2014 | Usuda | G01S 7/4914 |
| | | | 348/47 |
| 2014/0204427 A1 | 7/2014 | Nakazawa | |
| 2014/0204432 A1 | 7/2014 | Hashimoto et al. | |
| 2014/0211273 A1 | 7/2014 | Konno et al. | |
| 2014/0368893 A1 | 12/2014 | Nakazawa et al. | |
| 2015/0098117 A1 | 4/2015 | Marumoto et al. | |
| 2015/0116794 A1 * | 4/2015 | Nakazawa | H04N 1/193 |
| | | | 358/482 |
| 2015/0163378 A1 * | 6/2015 | Konno | H04N 25/701 |
| | | | 358/483 |
| 2015/0222790 A1 | 8/2015 | Asaba et al. | |
| 2015/0304517 A1 | 10/2015 | Nakazawa et al. | |
| 2016/0003673 A1 | 1/2016 | Hashimoto et al. | |
| 2016/0006961 A1 | 1/2016 | Asaba et al. | |
| 2016/0088179 A1 * | 3/2016 | Nakazawa | H01L 27/14636 |
| | | | 358/482 |
| 2016/0112660 A1 | 4/2016 | Nakazawa et al. | |
| 2016/0119495 A1 | 4/2016 | Konno et al. | |
| 2016/0173719 A1 | 6/2016 | Hashimoto et al. | |
| 2016/0268330 A1 * | 9/2016 | Nakazawa | H01L 27/14643 |
| 2016/0295138 A1 | 10/2016 | Asaba et al. | |
| 2016/0373604 A1 | 12/2016 | Hashimoto et al. | |
| 2017/0019567 A1 | 1/2017 | Konno et al. | |
| 2017/0126923 A1 | 5/2017 | Natori et al. | |
| 2017/0163836 A1 | 6/2017 | Nakazawa | |
| 2017/0170225 A1 * | 6/2017 | Asaba | H01L 27/14636 |
| 2017/0201700 A1 | 7/2017 | Hashimoto et al. | |
| 2017/0295298 A1 | 10/2017 | Ozaki et al. | |
| 2017/0302821 A1 | 10/2017 | Sasa et al. | |
| 2017/0324883 A1 * | 11/2017 | Konno | H04N 25/701 |
| 2018/0146150 A1 | 5/2018 | Shirado et al. | |
| 2018/0175096 A1 | 6/2018 | Inoue et al. | |
| 2018/0213124 A1 | 7/2018 | Yokohama et al. | |
| 2018/0261642 A1 * | 9/2018 | Asaba | H04N 25/134 |
| 2019/0208149 A1 | 7/2019 | Asaba et al. | |
| 2019/0268496 A1 * | 8/2019 | Nakazawa | H04N 25/701 |
| 2019/0289163 A1 | 9/2019 | Hashimoto et al. | |
| 2020/0053229 A1 | 2/2020 | Hashimoto et al. | |
| 2020/0053230 A1 | 2/2020 | Nakazawa et al. | |
| 2020/0053233 A1 | 2/2020 | Nakazawa et al. | |
| 2020/0410271 A1 | 12/2020 | Nakazawa et al. | |
| 2020/0412904 A1 | 12/2020 | Ohmiya et al. | |
| 2021/0021729 A1 | 1/2021 | Hashimoto et al. | |
| 2021/0144322 A1 * | 5/2021 | Wang | H04N 25/79 |

FOREIGN PATENT DOCUMENTS

| | | | | |
|---|---|---|---|---|
| EP | 2998995 | A2 | 3/2016 | |
| EP | 2998995 | A2 * | 3/2016 | H01L 27/14623 |
| JP | 0605898 | A1 * | 12/1993 | |
| JP | 6-217079 | A | 8/1994 | |
| JP | 6-217127 | A | 8/1994 | |
| JP | 2005-143134 | | 6/2005 | |
| JP | 2014-039205 | | 2/2014 | |
| JP | 2014039205 | A * | 2/2014 | |
| JP | 2015-41679 | A | 3/2015 | |
| JP | 2015-82648 | A | 4/2015 | |
| JP | 2016158151 | A * | 9/2016 | |
| JP | 2017-85501 | A | 5/2017 | |
| JP | 2017192092 | A * | 10/2017 | |
| JP | 2017-200020 | A | 11/2017 | |
| JP | 2017-208496 | | 11/2017 | |
| JP | 2017208496 | A * | 11/2017 | G02B 5/201 |
| JP | 2018011328 | A * | 1/2018 | H04N 1/02815 |
| JP | 2018101995 | A * | 6/2018 | |

OTHER PUBLICATIONS

Japanese Office Action issued Apr. 11, 2023 in corresponding Japanese Patent Application No. 2019-180197, 6pp.

* cited by examiner

PHOTOELECTRIC CONVERSION ELEMENT, READING DEVICE, AND IMAGE PROCESSING APPARATUS

CROSS-REFERENCE TO RELATED APPLICATIONS

The present application is based on PCT/IB2020/058694 filed on Sep. 18, 2020, and claims priority to JP 2019-180197 filed on Sep. 30, 2019, the entire contents of each are incorporated herein by reference.

TECHNICAL FIELD

Embodiments of the present disclosure relate to a photoelectric conversion element, a reading device, and an image processing apparatus.

BACKGROUND ART

In recent years, the document security consciousness has been increased. Above all, there is an increasing need for ensuring the originality of documents and determining the authenticity.

PTL 1 discloses an invisible information reading technique for ensuring the originality of documents, determining the authenticity, and preventing the forgery. Specifically, invisible information (e.g., infrared (IR) information) is embedded in a document and read by invisible light (e.g., infrared light) to ensure the originality of the document, determine the authenticity, and prevent the forgery.

PTL 2 discloses a red, green, and blue (RGB)+IR simultaneous reading technique of reading an RGB image and an IR image at the same time without reducing the productivity with a configuration of a 4-line image sensor in which IR pixels are added to ordinary RGB pixels.

CITATION LIST

Patent Literature

[PTL 1]
Japanese Unexamined Patent Application Publication No. 2005-143134
[PTL 2]
Japanese Patent No. 6101448

SUMMARY OF INVENTION

Technical Problem

However, the conventional RGB+IR simultaneous reading does not take noise resistance into consideration and therefore has some difficulties in reading the RGB image and the IR image at the same time with good signal/noise (S/N). This is mainly because no consideration is given to measures for charges accumulated in the IR pixels.

In light of the above-described problems, it is a general object of the present invention to provide a photoelectric conversion element, a reading device, and an image processing apparatus capable of reading a visible image and an invisible image at the same time while preventing a decrease in S/N.

Solution to Problem

In order to solve the above-described problems and achieve the object, there is provided a photoelectric conversion element as described in appended claims. Advantageous embodiments are defined by the dependent claims. Advantageously, the photoelectric conversion element includes a first pixel array including first light-receiving sections arranged in a direction and a second pixel array including second light-receiving sections arranged in the direction. Each of the first light-receiving sections includes a first pixel configured to receive at least light having a first wavelength inside a visible spectrum and a first pixel circuit configured to transmit a signal from the first pixel to a subsequent stage. Each of the second light-receiving sections includes a second pixel configured to receive at least light having a second wavelength outside the visible spectrum and a second pixel circuit configured to transmit a signal from the second pixel to the subsequent stage. The second pixel circuit is provided in a vicinity of the second pixel.

Advantageous Effects of Invention

The present invention enables simultaneous reading of a visible image and an invisible image while preventing a decrease in S/N in a low-sensitive, invisible region that is particularly difficult to deal with.

BRIEF DESCRIPTION OF DRAWINGS

The accompanying drawings are intended to depict example embodiments of the present invention and should not be interpreted to limit the scope thereof. The accompanying drawings are not to be considered as drawn to scale unless explicitly noted. Also, identical or similar reference numerals designate identical or similar components throughout the several views.

DESCRIPTION OF EMBODIMENTS

Figure 1:
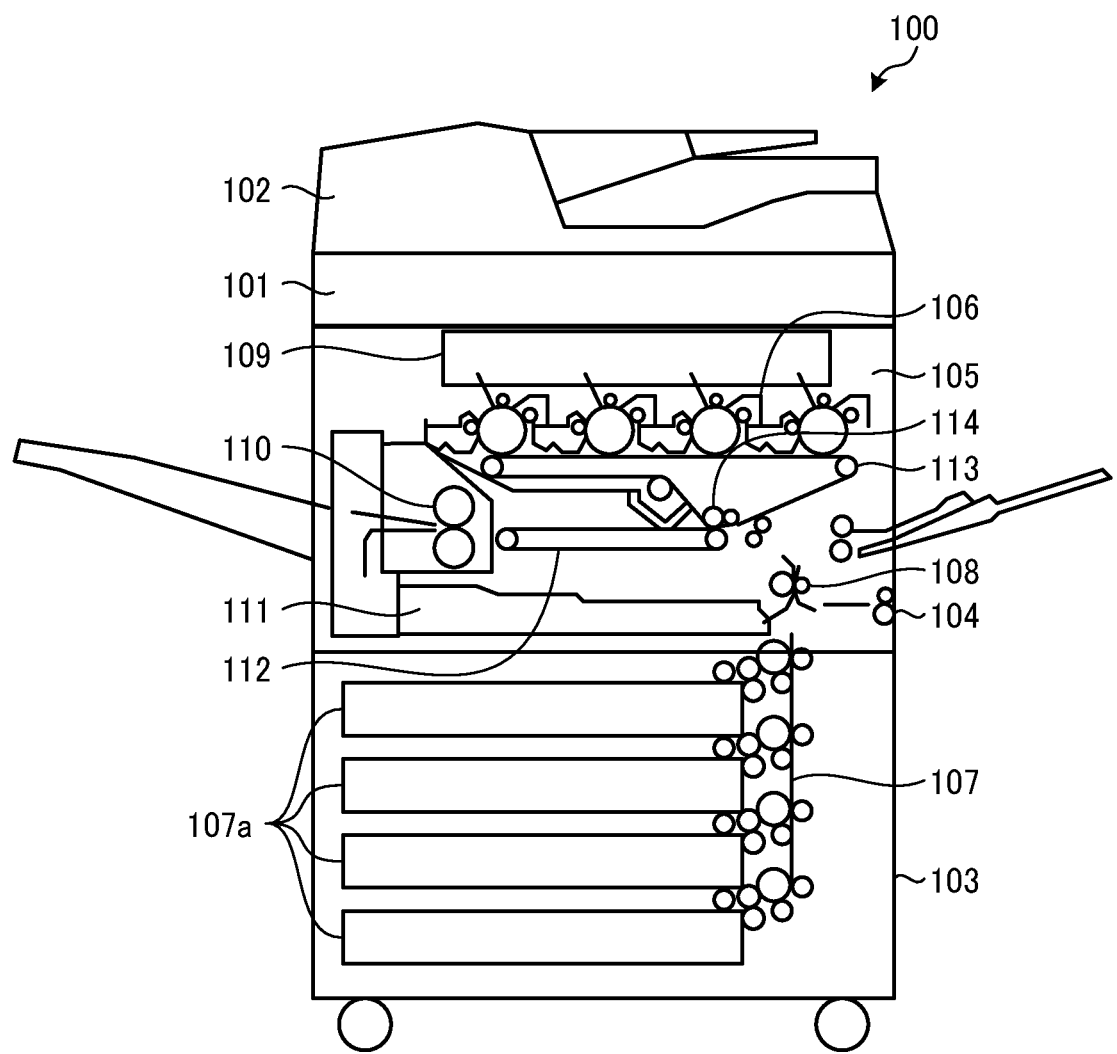
FIG. 1 is a schematic view of an image forming apparatus according to a first embodiment.

The terminology used herein is for the purpose of describing particular embodiments only and is not intended to be limiting of the present invention. As used herein, the singular forms "a", "an" and "the" are intended to include the plural forms as well, unless the context clearly indicates otherwise. In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result. Referring now to the drawings, wherein like reference numerals designate identical or corresponding parts throughout the several views, embodiments of the present disclosure are described in detail below.

First Embodiment

FIG. 1 is a schematic view of an image forming apparatus 100 according to a first embodiment. In FIG. 1, the image forming apparatus 100 serving as an image processing apparatus is generally called a multifunction peripheral, printer, or product (MFP) having at least two of copying, printing, scanning, and facsimile functions.

The image forming apparatus 100 includes an image reading unit 101 serving as a reading device, an automatic document feeder (ADF) 102 atop the image reading unit 101, and an image forming unit 103 below the image reading unit 101. In order to describe an internal configuration of the image forming unit 103, FIG. 1 illustrates the internal configuration of the image forming unit 103 from which an external cover is removed.

The ADF 102 is a document supporter that positions, at a reading position, a document or an original including an image to be read. The ADF 102 automatically feeds the document placed on a table to the reading position. The image reading unit 101 reads the document fed by the ADF 102 at the predetermined reading position. The image reading unit 101 includes a platen (or an exposure glass) as an upper surface of the image reading unit 101. The platen serves as a document supporter on which a document is placed. The image reading unit 101 reads the document on the platen, that is, at the reading position. Specifically, the image reading unit 101 is a scanner that includes a light source, an optical system, and a complementary metal oxide semiconductor (CMOS) image sensor inside. In the image reading unit 101, the light source illuminates the document. Reflected light from the document passes through the optical system and strikes the image sensor, which reads the reflected light. Thus, the image reading unit 101 reads the image or image data of the document.

The image forming unit 103 forms an image according to the image data read by the image reading unit 101. The image forming unit 103 includes a manual feed roller pair 104 through which a recording medium is manually inserted and a recording medium supply unit 107 that supplies a recording medium. The recording medium supply unit 107 includes an assembly that sends out recording media one by one from vertically-aligned input trays 107a. The recording medium thus supplied is sent to a secondary transfer belt 112 via a registration roller pair 108.

A secondary transfer device 114 transfers a toner image from an intermediate transfer belt 113 onto the recording medium conveyed on the secondary transfer belt 112.

The image forming unit 103 also includes an optical writing device 109, an image forming unit 105 employing a tandem system, the intermediate transfer belt 113, and the secondary transfer belt 112. Specifically, in an image forming process, the image forming unit 105 renders a latent image written by the optical writing device 109 visible as a toner image and forms the toner image on the intermediate transfer belt 113.

More specifically, the image forming unit 105 includes four rotatable, drum-shaped photoconductors to form yellow (Y), magenta (M), cyan (C), and black (K) toner images on the four photoconductors, respectively. Each of the four photoconductors is surrounded by various pieces of image forming equipment 106 including a charging roller, a developing device, a primary transfer roller, a cleaner unit, and a neutralizer. The pieces of image forming equipment 106 function around each of the four photoconductors to form a toner image on the corresponding photoconductor and transfer the toner image onto the intermediate transfer belt 113. Specifically, the primary transfer rollers transfer the toner images from the respective photoconductors onto the intermediate transfer belt 113. As a consequence, a composite toner image is formed on the intermediate transfer belt 113.

The intermediate transfer belt 113 is entrained around a drive roller and a driven roller and disposed so as to pass through primary transfer nips between the four photoconductors and the respective primary transfer rollers. As the intermediate transfer belt 113 rotates, the composite toner image constructed of the toner images primary-transferred onto the intermediate transfer belt 113 is conveyed to the secondary transfer device 114. The secondary transfer device 114 secondarily transfers the composite toner image onto the recording medium on the secondary transfer belt 112. As the secondary transfer belt 112 rotates, the recording medium is conveyed to a fixing device 110. The fixing device 110 fixes the composite toner image as a color image onto the recording medium. Finally, the recording medium is discharged onto an output tray disposed outside a housing of the image forming apparatus 100. Note that, in the case of duplex printing, a reverse assembly 111 reverses the front and back sides of the recording medium and sends out the reversed recording medium onto the secondary transfer belt 112.

Note that the image forming unit 103 is not limited to an electrophotographic image forming unit that forms an image by electrophotography as described above. Alternatively, the image forming unit 103 may be an inkjet image forming unit that forms an image in an inkjet printing system.

Now, a detailed description is given of the image reading unit 101 included in the image forming apparatus 100 described above.

Figure 2:
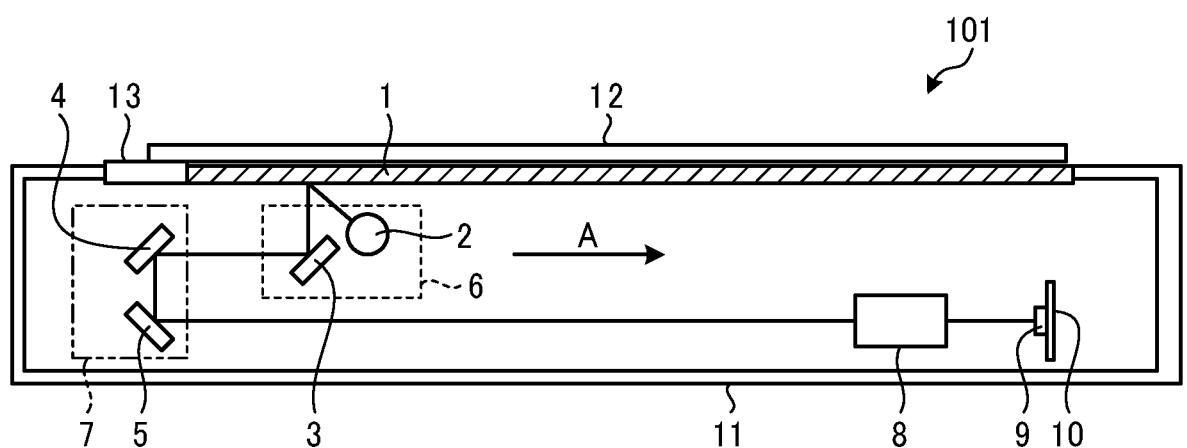
FIG. 2 is a cross-sectional view of an image reading unit, exemplifying a structure of the image reading unit.
Figure 6:
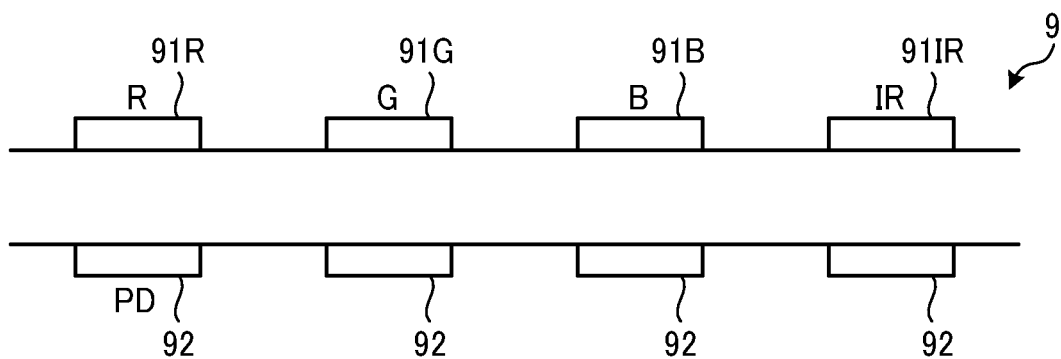
FIG. 6 is a diagram illustrating a layer configuration of color filters.
Figure 7:
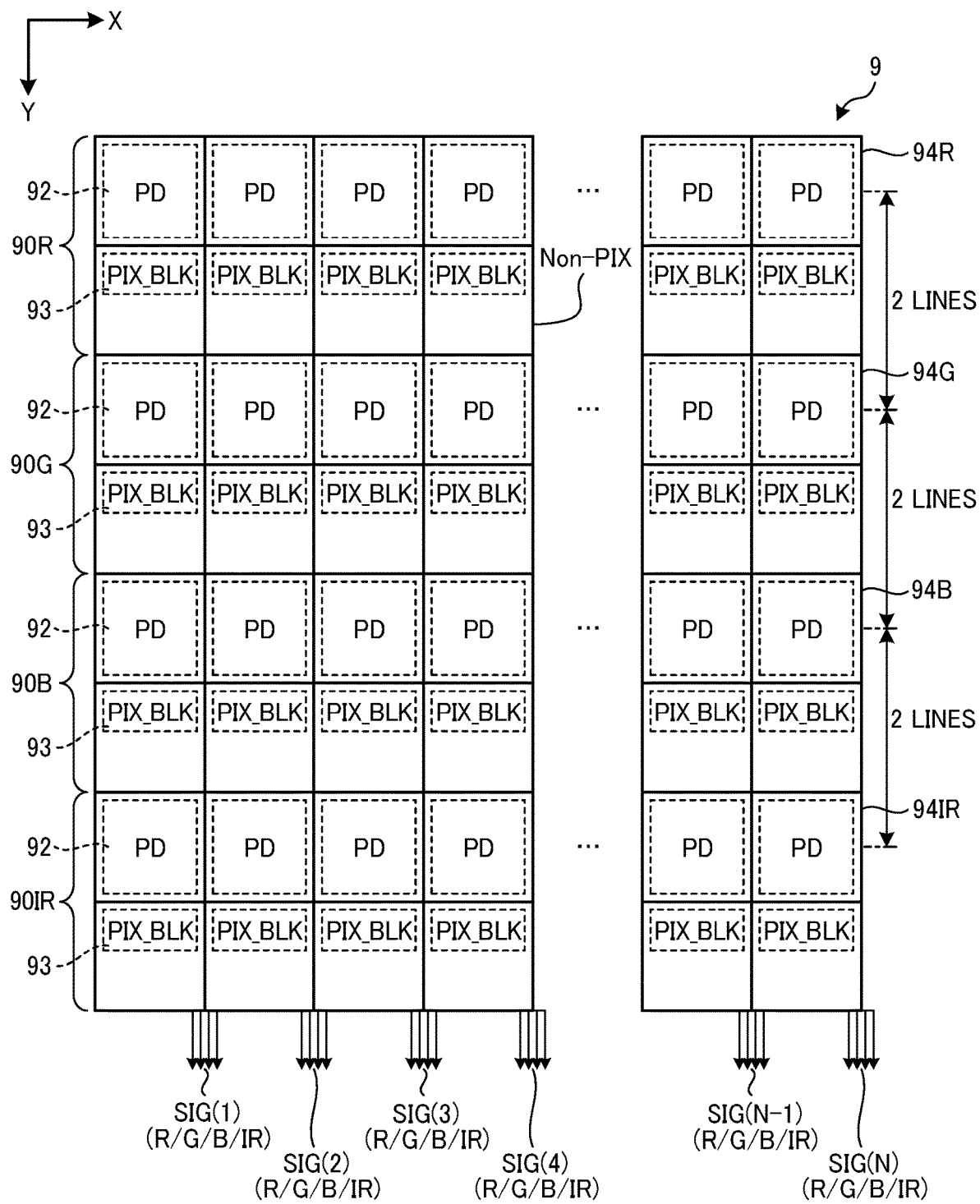
FIG. 7 is a schematic diagram illustrating a configuration of the image sensor.

FIG. 2 is a cross-sectional view of the image reading unit 101, exemplifying a structure of the image reading unit 101. As illustrated in FIG. 2, the image reading unit 101 includes, in a housing 11, a sensor substrate 10 provided with an image sensor 9 serving as a photoelectric conversion element, a lens unit 8, a first carriage 6, and a second carriage 7. The image sensor 9 is a reduction optical system sensor. For example, the image sensor 9 is a CMOS image sensor. The image sensor 9 includes a large number of photodiodes (PDs) 92 as pixels (as illustrated in FIGS. 6 and 7). The first carriage 6 includes a light source 2, which is a light emitting diode (LED), and a mirror 3. The second carriage 7 includes mirrors 4 and 5. The image reading unit 101 further includes a platen 1 and a reference white plate 13 as an upper surface of the image reading unit 101.

In a reading operation, the image reading unit 101 emits light upward from the light source 2 while moving the first carriage 6 and the second carriage 7 from home positions, respectively, in a sub-scanning direction A. The first carriage 6 and the second carriage 7 cause reflected light from a document 12 to be imaged on the image sensor 9 via the lens unit 8.

When the power is turned on, the image reading unit 101 reads reflected light from the reference white plate 13 and sets a reference. Specifically, the image reading unit 101 moves the first carriage 6 directly below the reference white plate 13, turns on the light source 2, and causes the reflected light from the reference white plate 13 to be imaged on the image sensor 9, thereby performing a gain adjustment.

Now, a detailed description is given of the light source 2 included in the image reading unit 101 described above.

Figure 3:
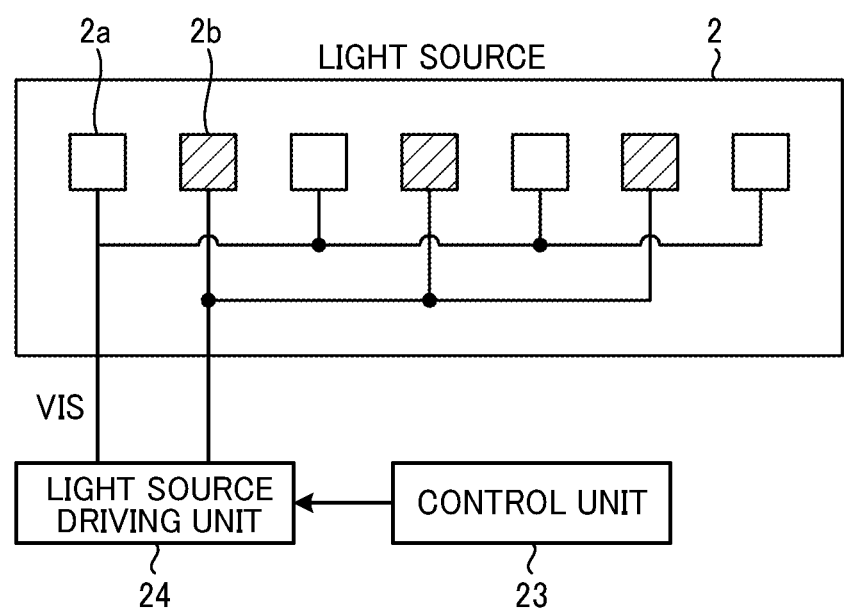
FIG. 3 is a diagram illustrating a configuration of a light source.

FIG. 3 is a diagram illustrating a configuration of the light source 2. As illustrated in FIG. 3, the light source 2 includes a visible light source 2a (white) for reading a visible image (i.e., visible information) and an infrared (IR) invisible light source 2b for reading an invisible image (i.e., invisible information). The visible light source 2a and the invisible light source 2b are arranged alternately within one light.

Figure 4A:
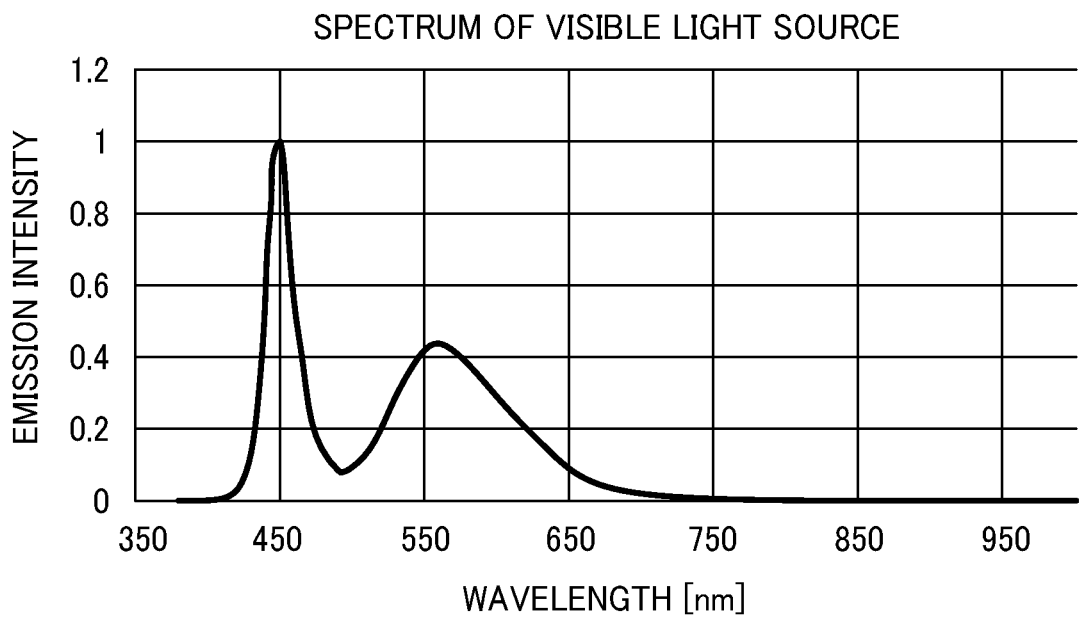
FIGS. 4A and 4B are graphs of spectra of the light source.
Figure 4B:
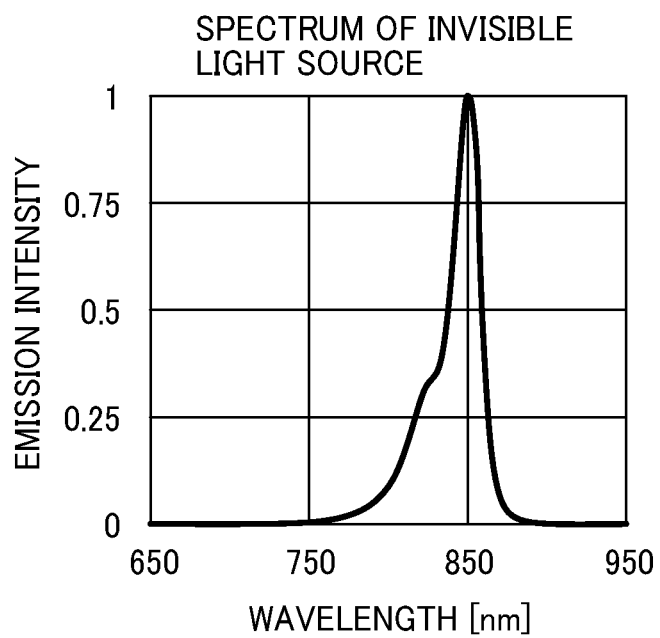

FIGS. 4A and 4B are graphs of spectra of the light source 2. Specifically, FIG. 4A is a graph of a spectrum of the visible light source 2a. FIG. 4B is a graph of a spectrum of the invisible light source 2b (IR). FIGS. 4A and 4B respectively illustrate an emission spectrum of the visible light source 2a (white) and an emission spectrum of the invisible light source 2b (IR) in a case in which the light source 2 is an LED.

Note that, in reading the visible and invisible images, either the visible image information or the invisible image information may be selectively read in the end. Therefore, in the present embodiment, an emission wavelength of the light source 2 is switched between visible and invisible wavelengths or spectra. A control unit 23 (illustrated in FIG. 12) causes a light source driving unit 24 (illustrated in FIG. 12) to switch the light source 2.

As described above, by switching between the visible light source 2a (white) and the invisible light source 2b (IR), the visible and invisible images are readable with a simple configuration.

Note that, in the present embodiment, the visible light source 2a (white) and the invisible light source 2b (IR) are arranged alternately within one light, for example. Alternatively, the visible light source 2a (white) and the invisible light source 2b (IR) may be separately arranged as two lights. Even in a case in which the visible light source 2a (white) and the invisible light source 2b (IR) are arranged within one light, the configuration is not necessarily limited to the aforementioned arrangement provided that the light source 2 is configured to illuminate a subject. For example, the visible light source 2a (white) and the invisible light source 2b (IR) may be arranged in a plurality of rows.

Now, a detailed description is given of the image sensor 9 included in the image reading unit 101 described above.

Figure 5:
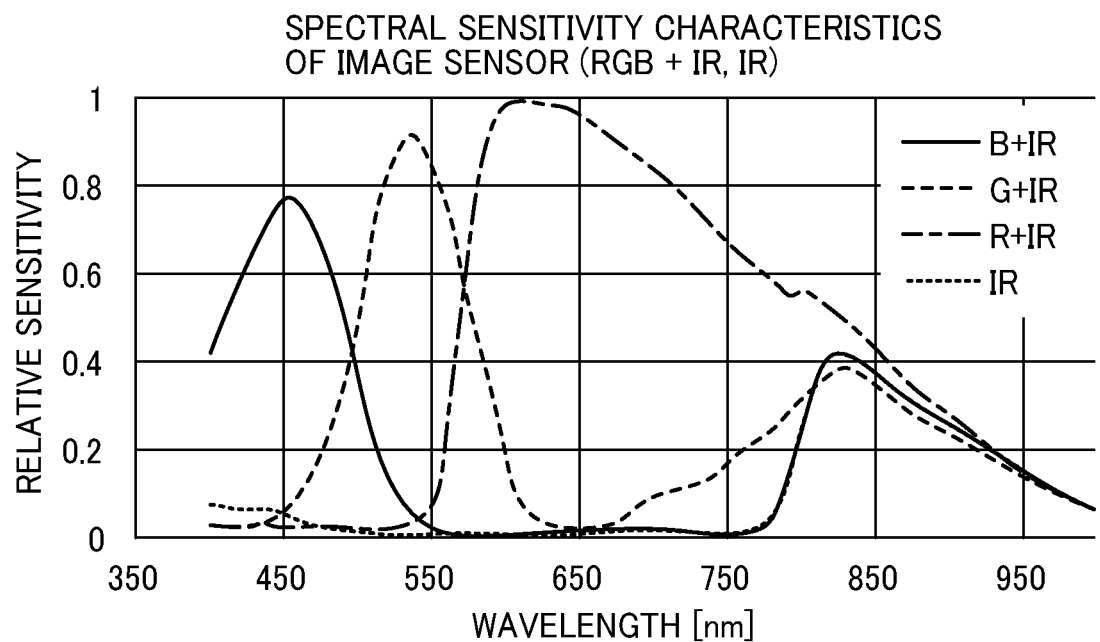
FIG. 5 is a graph of spectral sensitivity characteristics of an image sensor.

FIG. 5 is a graph of spectral sensitivity characteristics of the image sensor 9. The image sensor 9 of the present embodiment is a general silicon (Si) image sensor such as a CMOS image sensor. A general Si image sensor has quantum sensitivity even in an infrared (IR) region of 800 nm to 1000 nm. Therefore, by using a spectrum of an infrared (IR) region of 800 nm to 1000 nm as an invisible light region, the image sensor 9 is usable in a highly sensitive state and increases the S/N of the invisible image. Accordingly, the light use efficiency of the invisible image is enhanced. In short, a device that reads an invisible image is attained with a simple configuration.

The image sensor 9 of the present embodiment has a configuration in which RGB pixels respectively configured by the PDs 92 are distinguished from each other simply by color filters of RGB single colors, respectively, without IR cut filters. Therefore, FIG. 5 illustrates R+IR, G+IR, B+IR, and IR as the spectral sensitivity characteristics of the image sensor 9.

Note that, although the RGB reading is described in the present embodiment, the embodiments are not limited to the RGB reading. Alternatively, the embodiments are applicable to cyan, magenta, and yellow (CMY) reading or orange, green, and violet (OGV) reading. In addition, pixel arrays of the present embodiment are not limited to full-color pixel arrays. The pixel arrays may be simply G pixel arrays or monochrome pixel arrays without color filters, provided that the pixel arrays receive visible light.

FIG. 6 is a diagram illustrating a layer configuration of color filters of the image sensor 9. Typically, each of the RGB pixels has a two-layer structure in which the corresponding RGB single color filter and an IR cut filter (IRC) rest one atop another. An IR pixel has a single-layer structure mounted simply with a color filter that transmits IR alone.

By contrast, in the image sensor 9 of the present embodiment, RGB pixels as the PDs 92 have a single-layer structure mounted simply with RGB single color filters 91R, 91G, and 91B, respectively, as illustrated in FIG. 6. In addition, in the image sensor 9 of the present embodiment, an IR pixel as the PD 92 has a single-layer structure mounted simply with a color filter 91IR that transmits IR alone.

Color filters are generally applied by spin coating. As illustrated in FIG. 6, all the color filters 91R, 91G, 91B, and 91IR are configured with the same number of layers and have a uniform thickness between the color filters 91R, 91G, 91B, and 91IR, thereby reducing coating unevenness of the color filters 91R, 91G, 91B, and 91IR and preventing yield reduction.

As described above, the RGB pixels have a photosensitivity to IR simply with the single color filters 91R, 91G, 91B, and 91IR, without the IR cut filters. Accordingly, the single-layer structure with each of the color filters 91R, 91G, 91B, and 91IR saves cost.

Note that, although the IR cut filters are typically added to remove IR components mixed in RGB pixels, the embodiments easily attain the same advantageous effect as the IR cut filters by removing the IR components that is mixed in the RGB pixels with an image processing unit 25 (illustrated in FIG. 12) at a subsequent stage by use of a signal of an IR pixel.

A signal amount of the IR pixel is a fraction of a signal amount of RGB pixels. This is because, as illustrated in FIG. 5, an Si image sensor has a lower quantum sensitivity in the invisible, infrared (IR) region than a quantum sensitivity in the visible region. Therefore, although a signal attenuation does not affect the RGB pixels, the signal attenuation affects the IR pixel having a relatively small signal amount.

In addition, transferring charges over a long distance makes the charges susceptible to external noise. Such external noise has a greater impact on the IR pixel than on the RGB pixels.

As described above, the signal of the IR pixel is more likely to be affected by the signal attenuation and the external noise than the signals of the RGB pixels. Therefore, the S/N may be unfavorably decreased. To prevent the decrease in S/N, a signal (i.e., charge) output from a pixel is to be dealt with. In particular, the signal (i.e., charge) output from the pixel is to be dealt with in the case of a reduction optical system sensor having a pixel size reduced to about $\frac{1}{10}$ of a pixel size of a contact image sensor.

FIG. 7 is a schematic diagram illustrating a configuration of the image sensor 9. As illustrated in FIG. 7, the image sensor 9 has a 4-line pixel configuration in which IR pixels are added to RGB pixels.

As illustrated in FIG. 7, the image sensor 9 includes an array of R-pixel light-receiving sections (hereinafter referred to as an R-pixel array 90R serving as a third pixel array), an array of G-pixel light-receiving sections (hereinafter referred to as a G-pixel array 90G serving as a first pixel array), an array of B-pixel light-receiving sections (hereinafter referred to as a B-pixel array 90B serving as a fourth pixel array), and an array of IR-pixel light-receiving sections (hereinafter referred to as an IR-pixel array 90IR serving as a second pixel array). Each of the R-pixel array 90R, the G-pixel array 90G, the B-pixel array 90B, and the IR-pixel array 90IR extends along a main scanning direction X. The image sensor 9 includes the R-pixel array 90R, the G-pixel array 90G, the B-pixel array 90B, and the IR-pixel array 90IR in this order along a sub-scanning direction Y.

Specifically, the R-pixel array 90R includes multiple R-pixel light-receiving sections 94R serving as third light-receiving sections arranged in a row along the main scanning direction X at a constant pitch. The R-pixel array 90R receives red light, serving as light having a third wavelength inside a visible spectrum, from the light source 2. The R-pixel light-receiving section 94R includes the PD 92 as the R pixel serving as a third pixel and a pixel circuit (PIX_BLK) 93 serving as a third pixel circuit that performs charge-voltage conversion.

Note that, in the present embodiment, an area in which the PD 92 is located is hereinafter referred to as a pixel area (PIX); whereas an area in which the pixel circuit (PIX_BLK) 93 is located is hereinafter referred to as a non-pixel area (Non-PIX).

The G-pixel array 90G includes multiple G-pixel light-receiving sections 94G serving as first light-receiving sections arranged in a row along the main scanning direction X at a constant pitch. The G-pixel array 90G receives green light, serving as light having a first wavelength inside the visible spectrum, from the light source 2. The G-pixel light-receiving section 94G includes the PD 92 as the G pixel serving as a first pixel and the pixel circuit (PIX_BLK) 93 serving as a first pixel circuit that performs the charge-voltage conversion.

The B-pixel array 90B has multiple B-pixel light-receiving sections 94B serving as fourth light-receiving sections arranged in a row along the main scanning direction X at a constant pitch. The B-pixel array 90B receives blue light, serving as light having a fourth wavelength inside the visible spectrum, from the light source 2. The B-pixel light-receiving section 94B includes the PD 92 as the B pixel serving as a fourth pixel and the pixel circuit (PIX_BLK) 93 serving as a fourth pixel circuit that performs the charge-voltage conversion.

The IR-pixel array 90IR includes multiple IR-pixel light-receiving sections 94IR serving as second light-receiving sections arranged in a row along the main scanning direction X at a constant pitch. The IR-pixel array 90IR receives IR light, serving as light having a second wavelength outside the visible spectrum, from the light source 2. The IR-pixel light-receiving section 94IR includes the PD 92 as the IR pixel serving as a second pixel and the pixel circuit (PIX_BLK) 93 serving as a second pixel circuit that performs the charge-voltage conversion.

Note that the R-pixel array 90R, the G-pixel array 90G, the B-pixel array 90B, and the IR-pixel array 90IR are distinguished from each other simply by the color filters as described above. The R-pixel array 90R, the G-pixel array 90G, the B-pixel array 90B, and the IR-pixel array 90IR have the identical PDs 92 and circuit portions such as the pixel circuits (PIX_BLK) 93. Therefore, it can be regarded that the image sensor 9 includes a continuous pattern of four pixel arrays.

In the present embodiment, as illustrated in FIG. 7, the image sensor 9 includes the pixel circuit (PIX_BLK) 93 at a position adjacent to the pixel area (PIX) including the PD 92. A charge, which is a signal resulting from the photoelectric conversion by the PD 92, is output to the adjacent pixel circuit (PIX_BLK) 93, which performs the charge-voltage conversion to convert the charge into voltage, to generate a signal (SIG). The signal (SIG) is output to a subsequent stage independently for each pixel. Such a configuration minimizes a distance at which the charge is transferred from the PD 92 to the pixel circuit (PIX_BLK) 93, thus preventing the signal attenuation and noise superimposition.

In particular, in the IR-pixel array 90IR, the pixel circuit (PIX_BLK) 93 is arranged adjacent to the pixel area (PIX) including the PD 92 as the IR pixel. For example, in a case in which the IR pixel and the pixel circuit (PIX_BLK) 93 are arranged in the vicinity at a distance equivalent to several pixels, the signal attenuation and the noise superimposition can be prevented. The "vicinity" herein refers to a distance of, e.g., several-pixel width. In this case, the distance is sufficiently short to prevent the signal attenuation and the noise superimposition.

As illustrated in FIG. 7, the image sensor 9 has an interval of integer line between the visible light pixel arrays (namely, the R-pixel array 90R, the G-pixel array 90G, and the B-pixel array 90B) and the IR-pixel array 90IR. In the example illustrated in FIG. 7, the line interval is set to two lines. Considering that the pixel circuit (PIX_BLK) 93 is arranged in the vicinity of the PD 92, the "two lines" is the minimum of integer lines and most easily prevents misalignment. Such a configuration prevents the image mismatch or the misalignment between the visible image and the invisible image. Note that the line is a unit of a physical distance into which one main scanning line is converted. In the image sensor 9 of the present embodiment, one line is hereinafter described as a physical distance with a sub-scanning pixel width (i.e., sub-scanning width of a pixel (PD)) as a unit.

In addition, in the present embodiment, the IR pixel is described as an example of invisible light pixels. Since a general-purpose silicon semiconductor can be used by use of an IR area, the image sensor 9 can be configured at low cost. However, the invisible light pixel is not limited to the IR pixel. The advantageous effect of the embodiments can be attained by using another non-visible light pixel having a low sensitivity to visible light pixels such as an ultraviolet (UV) pixel.

Figure 8:
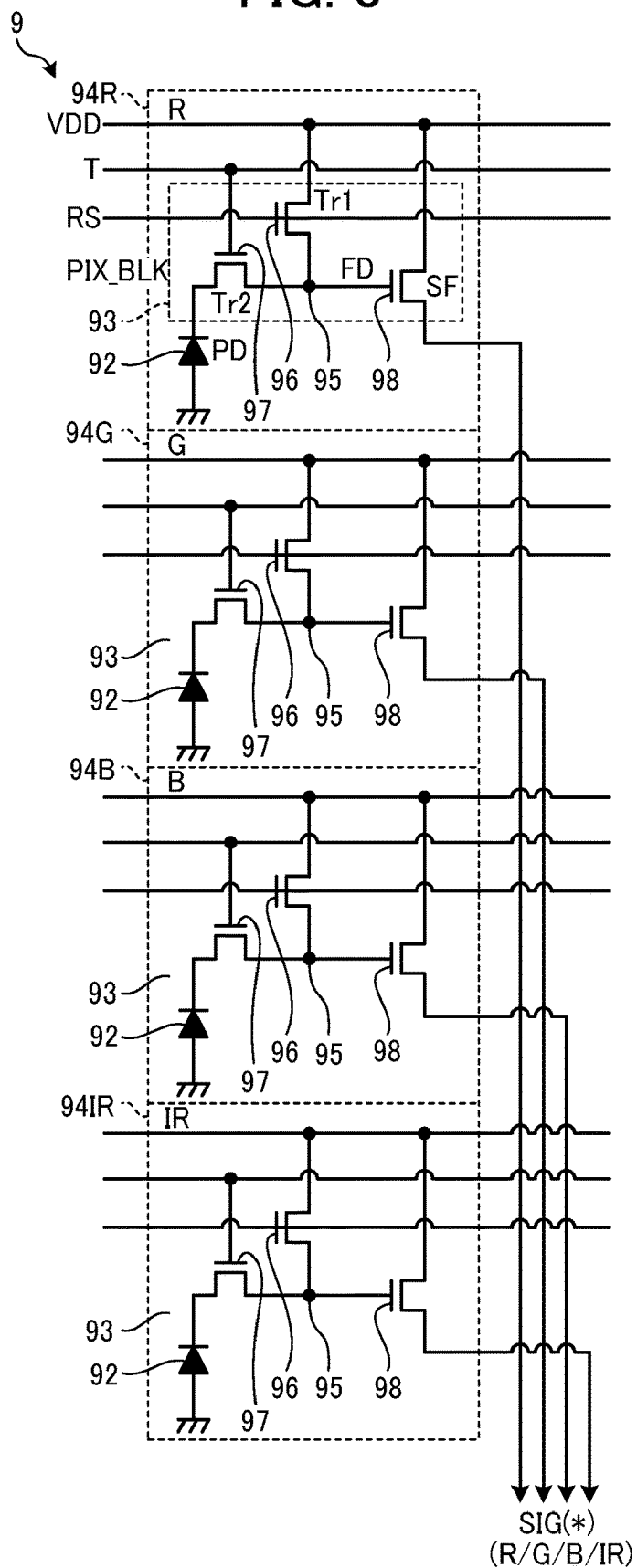
FIG. 8 is a diagram illustrating a configuration of a pixel circuit of the image sensor.

FIG. 8 is a diagram illustrating a configuration of the pixel circuit (PIX_BLK) 93 of the image sensor 9. As illustrated in FIG. 8, the image sensor 9 includes, in each of the R-pixel light-receiving section 94R, the G-pixel light-receiving section 94G, the B-pixel light-receiving section 94B, and the IR-pixel light-receiving section 94IR, the PD 92, a floating diffusion (FD) 95, a reset transistor (Tr1) 96, a transfer transistor (Tr2) 97, and a source follower (SF) 98. Note that, in FIG. 8, T represents a control signal of the transfer transistor (Tr2) 97. RS represents a control signal of the reset transistor (Tr1) 96. VDD represents a power supply for each of the reset transistor (Tr1) 96 and transfer transistor (Tr2) 97.

As illustrated in FIG. 8, the light incident on the image sensor 9 is photoelectrically converted by the PD 92 into a charge. The charge is transferred to the floating diffusion (FD) 95 via the transfer transistor (Tr2) 97. The charge transferred to the FD 95 is converted into a voltage signal and output to a subsequent stage via the source follower (SF) 98. After the FD 95 outputs the signal, the reset transistor (Tr1) 96 resets the charge.

As described above, in a case in which the image processing unit 25 (illustrated in FIG. 12) at a subsequent stage performs correction of removing the IR components that is mixed in the RGB pixels by use of a signal of the IR pixel, the IR components included in the RGB pixels and the IR component in the IR pixel are desirably equal.

Figure 9:
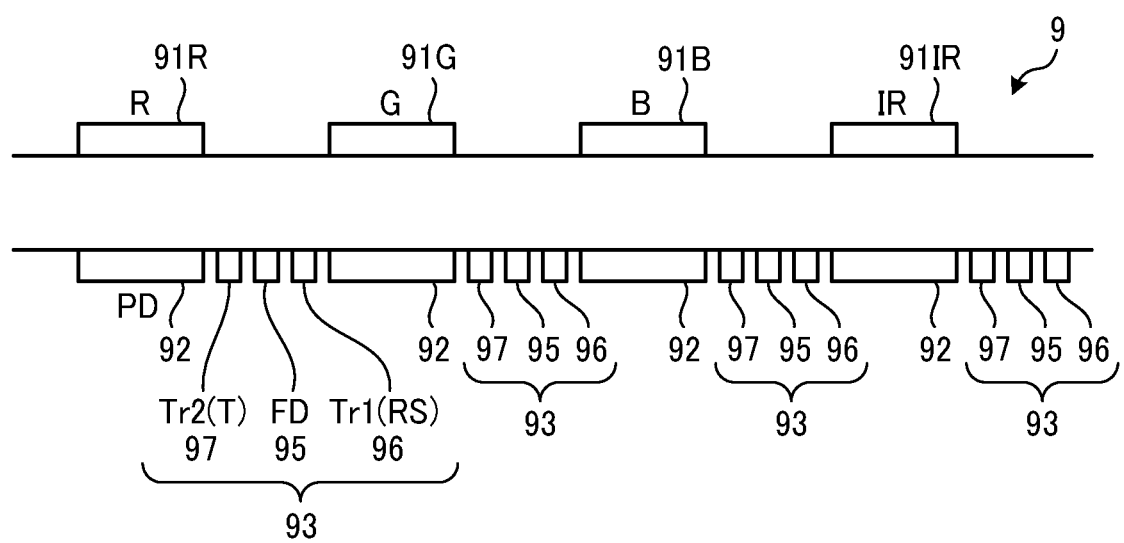
FIG. 9 is a schematic diagram illustrating a physical structure of the pixel circuit of the image sensor.

FIG. 9 is a schematic diagram illustrating a physical structure of the pixel circuit (PIX_BLK) 93 of the image sensor 9. As illustrated in FIG. 9, in the image sensor 9, the RGB pixels (or RGB pixel arrays) and the IR pixel (or IR pixel array) have identical physical structures (e.g., size and location) and configurations of the pixel circuit (PIX_BLK) 93 including the Tr1 (RS) 96, the Tr2 (T) 97, and the FD 95. Note that, although FIG. 9 does not illustrate the SF 98, the FD 95 may be considered corresponding to the SF 98. Accordingly, by matching the IR characteristics of RGB pixels and the IR characteristics of IR pixels, the IR components (i.e., invisible components) are easily removable from the RGB images (i.e., visible images).

Figure 10A:
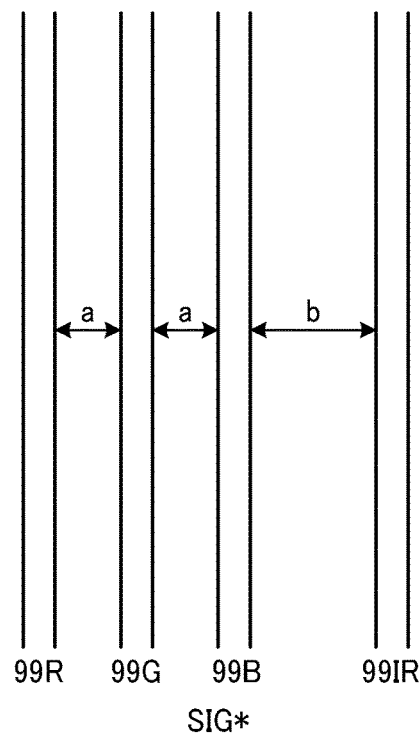
FIGS. 10A and 10B are diagrams illustrating layouts of RGB and IR signal lines.
Figure 10B:
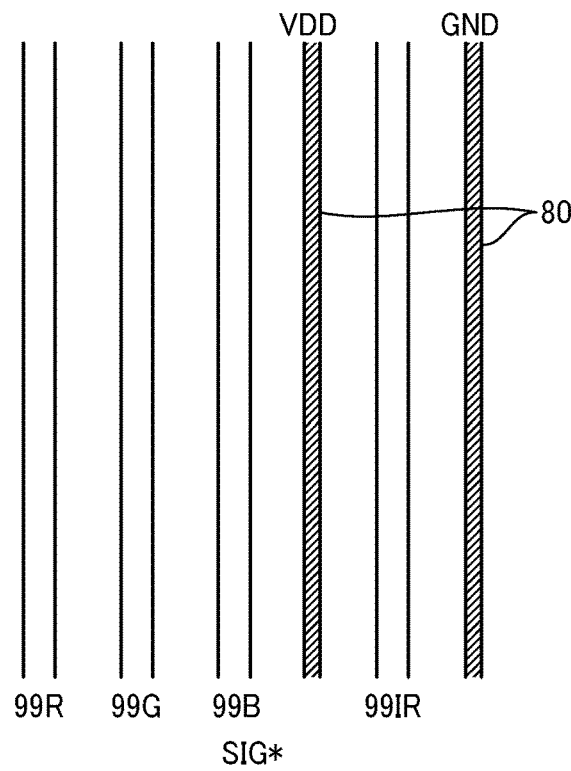

FIGS. 10A and 10B are diagrams illustrating layouts of RGB and IR signal lines.

As described above with reference to FIG. 5, since the IR pixel has a lower sensitivity than the sensitivity of the RGB pixels, the signal amount of the IR pixel is smaller than the signal amount of the RGB pixels. Therefore, the noise has a greater impact on the IR pixel than on the RGB pixels. Although the RGB and IR signal lines are evenly arranged in FIG. 8, crosstalk between the signals may arise due to the parasitic capacitance between the signal lines. In particular, when the IR pixel signal receives crosstalk from other RGB signals, the impact of the crosstalk is great and affects image quality.

FIG. 10A is an enlarged view of a signal line (specifically, a portion output from the pixel circuit (PIX_BLK) 93 to a subsequent stage) illustrated in FIG. 8. Signal lines 99R, 99G, and 99B respectively serving as output lines of the RGB pixels are arranged at a distance a from each other; whereas a signal line 99IR of the IR pixel is arranged at a distance b from the signal line 99B of the B pixel (where a<b). That is, the distance between the signal line 99B of the B pixel and the signal line 99IR of the IR pixel is longer than the distance between the adjacent signal lines 99R, 99G, and 99B of the RGB pixels, respectively. Such a configuration reduces the crosstalk from the RGB pixel signals to the IR pixel signal.

Different from the arrangement illustrated in FIG. 10A, FIG. 10B illustrates an example in which shield lines 80 are arranged on both sides across the signal line 99IR of the IR pixel In this case, the shield lines 80 absorb a noise (i.e., crosstalk) component from the RGB pixel signals (in particular, the B pixel signal) to reduce the crosstalk from the RGB pixel signals to the IR pixel signal.

Note that the shield lines 80 can be easily implemented provided that the shield lines 80 are low impedance lines. Although FIG. 10B illustrates the shield lines 80 as a power supply (VDD) and a ground (GND), respectively. Alternatively, for example, the shield lines 80 may be signal lines equivalent to the power supply and the GND, respectively.

Figure 11A:
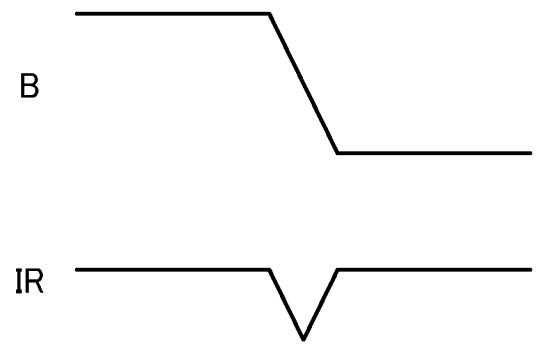
FIGS. 11A to 11C are diagrams illustrating reduction effects of crosstalk from a visible light signal.
Figure 11B:
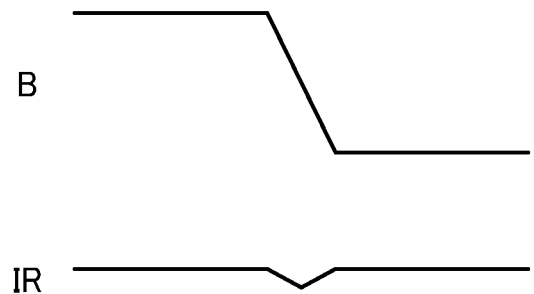
Figure 11C:
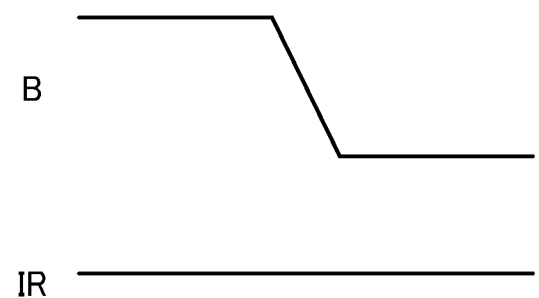

FIGS. 11A to 11C are diagrams illustrating reduction effects of crosstalk from a visible light signal. Specifically, FIG. 11A illustrates a case in which the signal line 99IR of the IR pixel and the signal line 99B of the B pixel are arranged at an interval identical to the intervals between the adjacent signal lines 99R, 99G, and 99B of the RGB pixels, respectively. FIG. 11A illustrates a state in which the variation due to a fall of the adjacent B pixel signal causes crosstalk to the IR pixel signal.

By contrast, FIG. 11B illustrates a case in which the signal lines 99R, 99B, 99G, and 99IR are arranged as illustrated in FIG. 10A. As illustrated in FIG. 11B, the crosstalk is reduced because the distance between the signal line 991R of the IR pixel and the signal line 99B of the B pixel is longer than the distance between the adjacent signal lines 99R, 99G, and 99B of the RGB pixels, respectively.

FIG. 11C illustrates a case in which the signal lines 99R, 99B, 99G, and 99IR are arranged as illustrated in FIG. 10B. As illustrated in FIG. 11C, the crosstalk to the IR pixel is reduced because the shield lines 80 completely absorb the crosstalk component.

Figure 12:
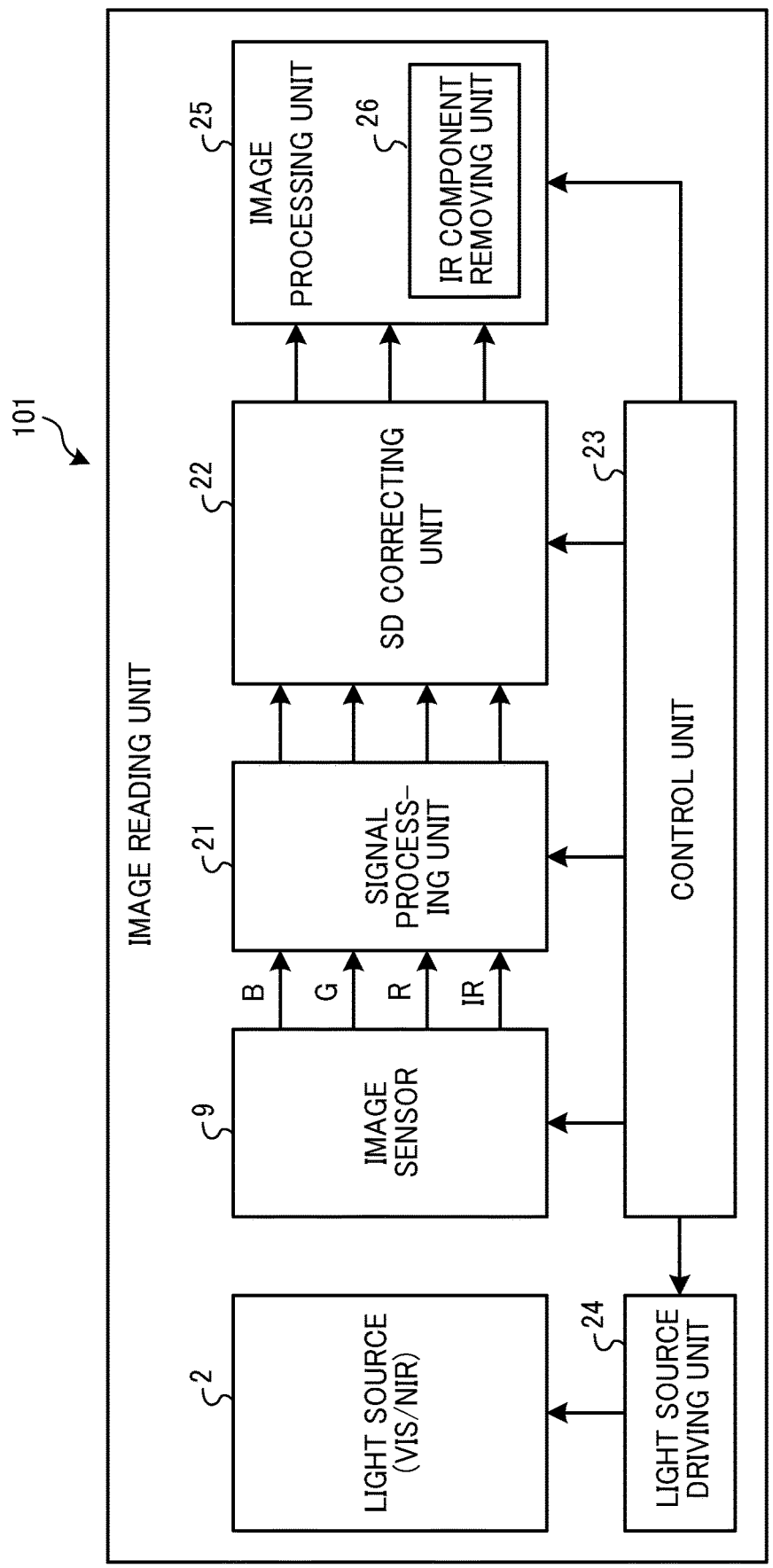
FIG. 12 is a block diagram illustrating electric connections of components of the image reading unit.

FIG. 12 is a block diagram illustrating electric connections of components of the image reading unit 101. In addition to the image sensor 9 and the light source 2 described above, the image reading unit 101 includes a signal processing unit 21, a shading (SD) correcting unit 22 serving as a signal correcting unit, the control unit 23, the light source driving unit 24, and the image processing unit 25 as illustrated in FIG. 12.

As described above, the light source 2 is configured as visible/IR light source. The light source driving unit 24 drives the light source 2.

The signal processing unit 21 includes a gain controller (i.e., amplifier), an offset controller, and an analog-to-digital (A/D) converter. The signal processing unit 21 executes gain control, offset control, and A/D conversion on image signals (RGB) output from the image sensor 9.

The control unit 23 selectively controls a visible image mode and an IR image mode. The control unit 23 controls settings of the light source driving unit 24, the image sensor 9, the signal processing unit 21, and the SD correcting unit 22. The control unit 23 serves as reading control means that selectively controls a first reading operation and a second reading operation.

In the first reading operation, shading correction is executed, by use of a first reference data, on data obtained by reading a subject in a visible light region. In the second reading operation, the shading correction is executed, by use of a second reference data, on data obtained by reading the subject in an invisible light region.

The SD correcting unit 22 includes a line memory and executes the shading correction. Specifically, in the shading correction, the SD correcting unit 22 normalizes, with the reference white plate 13, and thus corrects a main scanning distribution such as sensitivity variation of the image sensor 9 for each pixel and unevenness in light amount.

The image processing unit 25 executes various types of image processing. For example, the image processing unit 25 includes an IR component removing unit 26 serving as an invisible component removing unit. The IR component removing unit 26 removes an IR component (serving as a second wavelength component) that is mixed in each of RGB pixels by use of a signal of an IR pixel. Such a configuration prevents reduction of color reproduction of a visible image (i.e., RGB image) and also prevents a decrease in S/N. With such a configuration, a high-quality invisible image (i.e., IR image) is obtained.

As described above, according to the present embodiment, the pixel circuit (PIX_BLK) 93 provided adjacent to the IR pixel minimizes the transfer distance of the charge, which is a signal resulting from the photoelectric conversion, rendering a long-distance transfer unnecessary. Accordingly, the present embodiment prevents the attenuation of the IR pixel signal and the superimposition of external noise. Thus, the present embodiment enables simultaneous reading of an RGB image and an IR image while preventing a decrease in S/N in a low-sensitive, infrared (i.e., invisible) region that is particularly difficult to deal with.

In the present embodiment, the pixel circuit (PIX_BLK) 93 is arranged adjacent to the pixel area of the IR pixel. Similarly, the pixel circuit (PIX_BLK) 93 is arranged adjacent to the pixel area of each of the RGB pixels. Accordingly, the present embodiment enables invisible reading (i.e., reading of the IR image) and full-color reading (i.e., reading of the RGB images) at the same time while preventing the decrease in S/N.

In addition, since the pixel circuit (PIX_BLK) 93 is arranged adjacent to the pixel area for each pixel, the charge transfer distance is minimized for each pixel. Accordingly, the decrease in S/N is prevented over all pixels.

Second Embodiment

A description is now given of a second embodiment.

In the first embodiment, the correction is facilitated by matching the IR characteristics of RGB pixels and the IR characteristics of IR pixels. The second embodiment is different from the first embodiment in that the structure of the pixel circuit (PIX_BLK) 93 of the IR pixel is different from the structure of the pixel circuit (PIX_BLK) 93 of the RGB pixels. A redundant description of identical features in the first and second embodiments is herein omitted; whereas a description is now given of features of the second embodiment different from the features of the first embodiment.

Figure 13:
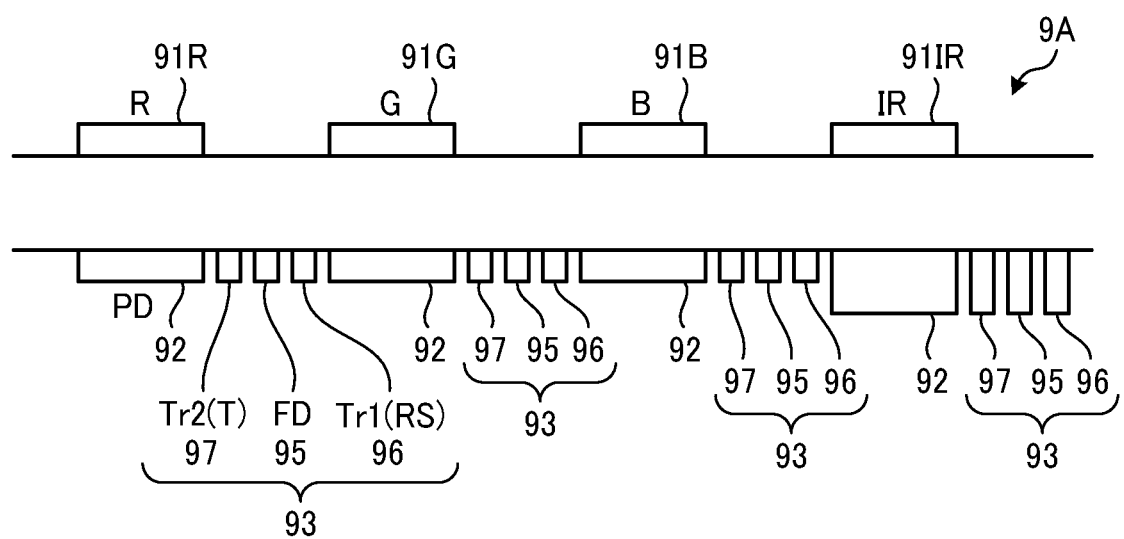
FIG. 13 is a schematic diagram illustrating a physical structure of a pixel circuit of an image sensor according to a second embodiment.

FIG. 13 is a schematic diagram illustrating a physical structure of the pixel circuit (PIX_BLK) 93 of an image sensor 9A according to the second embodiment. FIG. 9 illustrates a configuration that facilitates correction by matching the IR characteristics of the RGB pixels and the IR characteristics of the IR pixels. However, since the IR pixel has a lower light receiving sensitivity than the light receiving sensitivity of the RGB pixels, an increased sensitivity may be desired in some cases.

To address such a situation, in the present embodiment, the physical structure (e.g., size and location) and configuration of the pixel circuit (PIX_BLK) 93 of the IR pixel are different from the physical structure (e.g., size and location) and configuration of the pixel circuit (PIX_BLK) 93 of the RGB pixels as illustrated in FIG. 13, so as to increase the sensitivity of the IR pixel. FIG. 13 illustrates the physical structures of the PDs 92 and the pixel circuits (PIX_BLK) 93. FIG. 13 is different from FIG. 9 in that the PD 92 and the pixel circuit (PIX_BLK) 93 of the IR pixel are configured at deeper positions.

Here, it is known that the quantum sensitivity of silicon is higher (i.e., the light is more likely to be absorbed) at a position closer to a silicon surface as the wavelength is shorter; whereas the quantum sensitivity of silicon is higher at a deeper position in the silicon as the wavelength is longer. That is, infrared light is likely to be photoelectrically converted at the deeper position in the silicon than RGB light. In other words, the light receiving sensitivity to the infrared light is higher at the deeper position in the silicon than the RGB light. This is because of the wavelength dependence of silicon quantum sensitivity in a depth direction.

Therefore, in the image sensor 9A illustrated in FIG. 13, the PD 92 of the IR pixel is extended to a position deeper than the positions of the PDs 92 of the RGB pixels. Thus, the IR light receiving sensitivity is increased.

Relatedly, in the image sensor 9A illustrated in FIG. 13, the pixel circuit (PIX_BLK) 93 including the Tr1 (RS) 96, the Tr2 (T) 97, and the FD 95 is also configured to a position deeper than the positions of the pixel circuits (PIX_BLK) 93 of the RGB pixels, taking into account that the charge is generated at a deeper position and then moved.

As described above, according to the present embodiment, the PD 92 and the pixel circuit (PIX_BLK) 93 of the IR pixel are arranged to a position deeper than the positions of the PDs 92 and the pixel circuits (PIX_BLK) 93 of the RGB pixels. Such a configuration prevents a decrease in the light receiving sensitivity to the invisible region.

Third Embodiment

A description is now given of a third embodiment.

The third embodiment is different from the first and second embodiments in that dummy pixel arrays are respectively arranged above and below the R-pixel array 90R, the G-pixel array 90G, the B-pixel array 90B, and the IR-pixel array 90IR. A redundant description of identical features in the first to third embodiments is herein omitted; whereas a description is now given of features of the third embodiment different from the features of the first and second embodiments.

Figure 14:
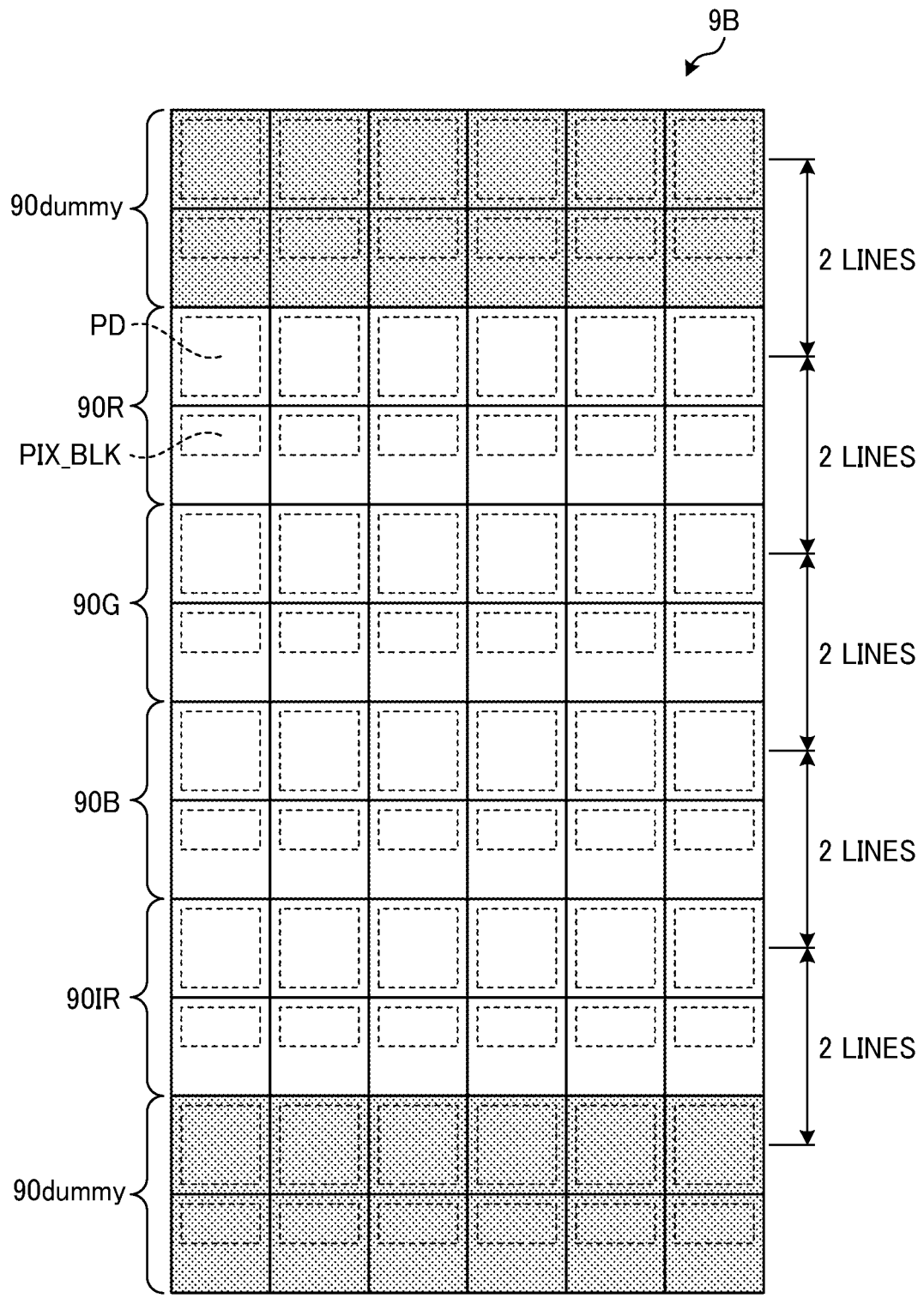
FIG. 14 is a schematic diagram illustrating a configuration of an image sensor according to a third embodiment.

FIG. 14 is a schematic diagram illustrating a configuration of an image sensor 9B according to the third embodiment.

In the semiconductor process, it is generally known that the characteristics are more likely to change at end portions of a continuous pattern than at other portions of the continuous pattern. This is because, during manufacturing, the semiconductor process is affected by a peripheral pattern (or design), and the end portions of the continuous pattern becomes the boundary of the pattern. In the case of the image sensor 9 described above, the R-pixel array 90R or the IR-pixel array 90IR is a pattern boundary in the configuration illustrated in FIG. 7. Therefore, the characteristics are more likely to change at the R-pixel array 90R or the IR-pixel array 90IR as a pattern boundary than at the other arrays, namely, the G-pixel array 90G and the B-pixel array 90B.

To address such a situation, in the image sensor 9B of the present embodiment, a dummy pixel array 90dummy that imitates a pixel array and a pixel circuit is additionally arranged at each end portion of a sensing area including at least the IR-pixel array 90IR. In the example illustrated in FIG. 14, the dummy pixel arrays 90dummy are arranged above the R-pixel array 90R and below the IR-pixel array 90IR, respectively. The R-pixel array 90R and the IR-pixel array 90IR become a part of the continuous pattern as the dummy pixel arrays 90dummy are added. That is, the R-pixel array 90R and the IR-pixel array 90IR are not boundary pixels of the pattern any longer. As a consequence, the conditions of the peripheral pattern become identical for R, G, B, and IR, thus reducing the characteristic difference between pixels (i.e., colors).

Note that, since the continuity of the circuit pattern is significant, any color filter may be used for the dummy pixel arrays 90dummy illustrated in FIG. 14. This is because, in the manufacturing process, generally, application of a color filter follows generation of a circuit.

As described above, according to the present embodiment, the characteristics between colors are equalized regardless of the visible or invisible region.

Fourth Embodiment

A description is now given of a fourth embodiment.

The fourth embodiment is different from the first to third embodiments in that the IR pixel is arranged away from the RGB pixels. A redundant description of identical features in the first to fourth embodiments is herein omitted; whereas a description is now given of features of the fourth embodiment different from the features of the first to third embodiments.

Figure 15:
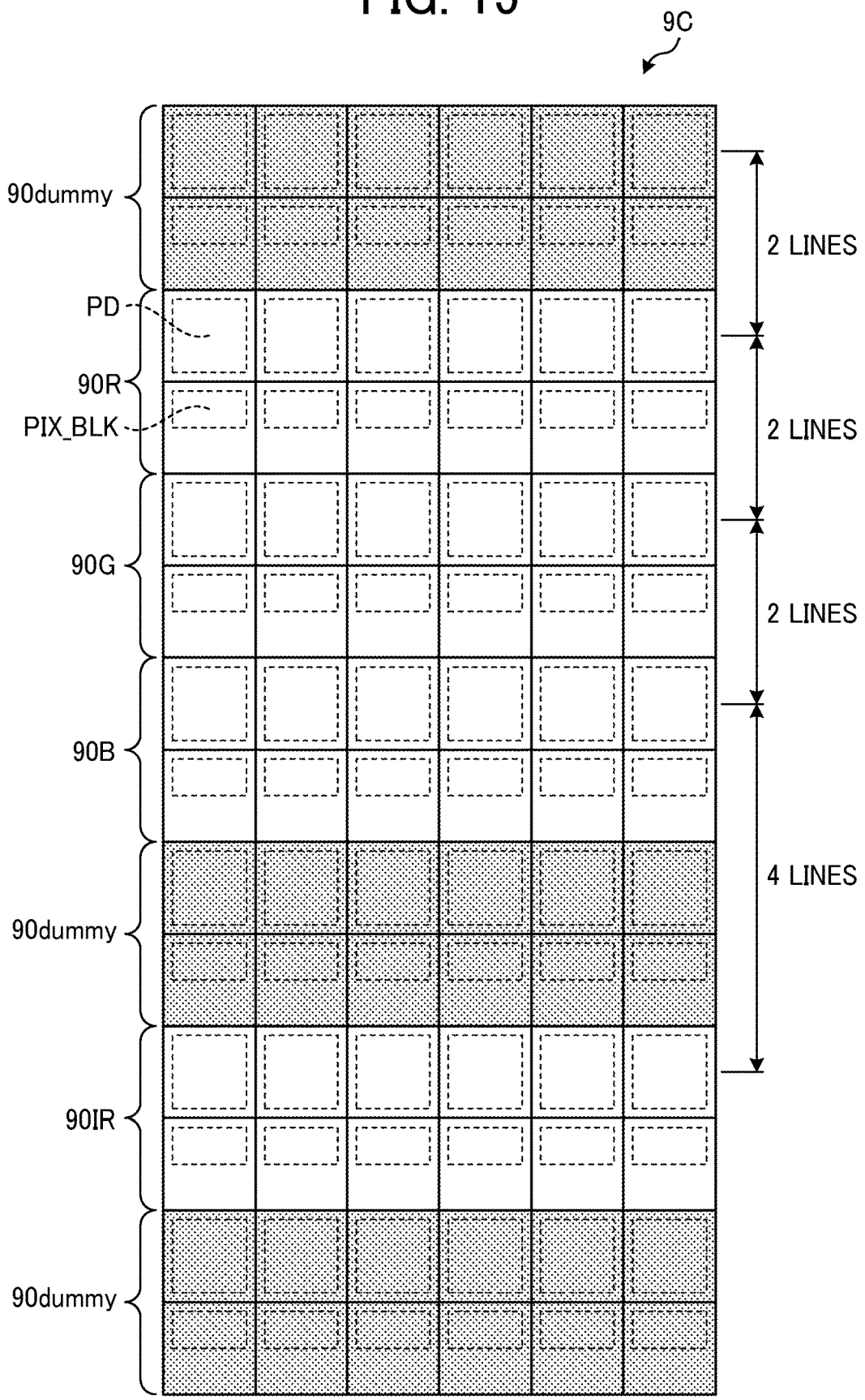
FIG. 15 is a schematic diagram illustrating a configuration of an image sensor according to a fourth embodiment.

FIG. 15 is a schematic diagram illustrating a configuration of an image sensor 9C according to the fourth embodiment.

The crosstalk between pixel signals, that is, the electrical crosstalk is mentioned above with reference to FIGS. 10A and 10B. As described above in the third embodiment, with respect to the quantum sensitivity of silicon, received light is photoelectrically converted in different depths depending on the wavelength of the light received. Therefore, the charge between pixels may unfavorably cause the crosstalk. In particular, the infrared light is photoelectrically converted at a deeper position. Therefore, when the control by the electric field is insufficient, the charge resulting from the photoelectric conversion floats inside the silicon and enters a pixel (i.e., PD 92) of another color, thus becoming a factor of the crosstalk.

To address such a situation, the image sensor 9C of the present embodiment has a configuration in which the IR pixel is distanced from the RGB pixels as illustrated in FIG. 15. FIG. 15 illustrates an example in which the IR-pixel array 90IR is distanced alone from the other pixel arrays. Specifically, the IR-pixel array 90IR is apart from the B-pixel array 90B at a 4-line interval, which is wider than the intervals between the RGB pixels. In the present embodiment, the dummy pixel array 90dummy that imitates a pixel array and a pixel circuit is inserted between the B-pixel array 90B and the IR-pixel array 90IR to maintain the continuity of the circuit pattern.

As described above, the present embodiment reduces the impact of crosstalk caused by the charge between pixels, from the IR pixel to the RGB pixels.

Note that, in the example illustrated in FIG. 15, the B-pixel array 90B is arranged as an adjacent pixel array of the IR-pixel array 90IR to maximize the difference of wavelength of incident light between the adjacent pixel arrays (in this case, the B wavelength is about 450 nm; whereas the IR wavelength is about 800 nm). Such arrangement of the pixel arrays maximizes the difference of depth position at which the light is photoelectrically converted, thus reducing the impact of the charge crosstalk to the maximum extent.

Fifth Embodiment

A description is now given of a fifth embodiment.

The fifth embodiment is different from the first to fourth embodiments in that a plurality of AD converters (ADC) are provided at a subsequent stage and in the vicinity of the pixel circuit (PIX_BLK) 93. A redundant description of identical features in the first to fifth embodiments is herein omitted; whereas a description is now given of features of the fifth embodiment different from the features of the first to fourth embodiments.

Figure 16:
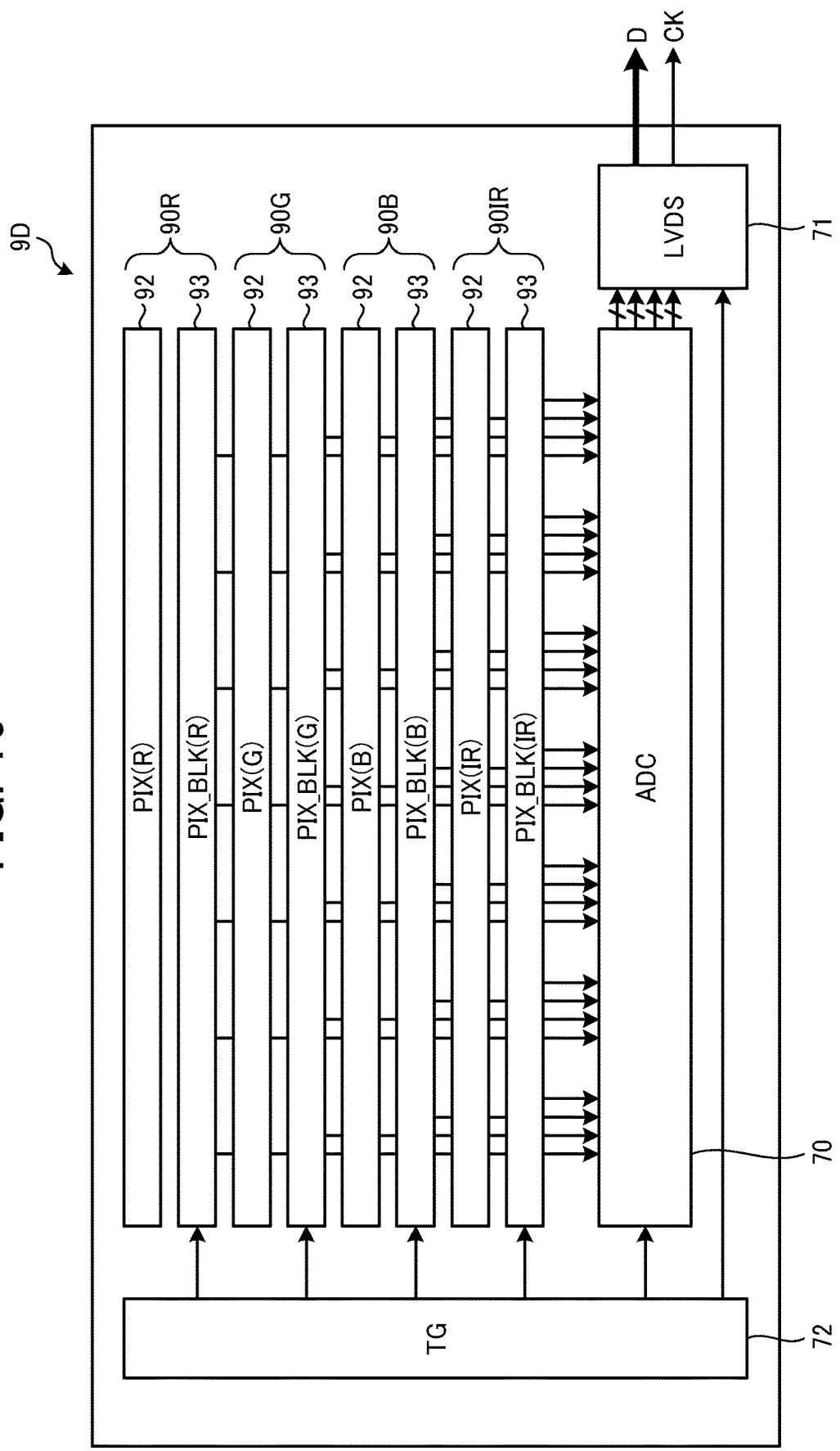
FIG. 16 is a schematic diagram illustrating a configuration of an image sensor according to a fifth embodiment.

FIG. 16 is a schematic diagram illustrating a configuration of an image sensor 9D according to the fifth embodiment.

As illustrated in FIG. 16, in the image sensor 9D according to the present embodiment, the IR pixel is arranged in addition to the RGB pixels while the pixel circuits (PIX_BLK) 93 are arranged in the vicinity of the respective pixel areas (PIX). In addition, the image sensor 9D includes a plurality of AD converters (ADC) 70 at the subsequent stage and in the vicinity of the pixel circuit (PIX_BLK) 93.

Note that the "vicinity" refers to a distance at which the signals are transferrable within a predetermined period of time. For example, the difference of distance from the individual pixels (i.e., PDs 92) to the ADC 70 that processes the signals from the individual pixels is not excessively large (or more than two digits). That is, in the image sensor 9D, the ADC 70 is arranged in the vicinity of the pixels (i.e., PDs 92) and the pixel circuits (PIX_BLK) 93 to extremely shorten an analog path.

The image sensor 9D further includes a low voltage differential signals or signaling (LVDS) 71 which is a differential interface. The image sensor 9D further includes a timing generator (TG) 72. The TG 72 supplies a control signal to each block and controls the operation of the entire image sensor 9D.

The image sensor 9D according to the present embodiment performs A/D conversion with the ADC 70 in the same chip and transmits image data to a subsequent stage with the LVDS 71.

As described above, according to the present embodiment, the ADC 70 is arranged in the vicinity of the pixels (i.e., PDs 92) and the pixel circuits (PIX_BLK) 93 to perform the A/D conversion in the same chip. Although an IR pixel is added, such a configuration allows an increase in operation speed and generation of a high-quality image with good S/N.

Note that, although the pixel circuits (PIX_BLK) 93 are connected to the ADC 70 in FIG. 16, any circuit such as pin grid array (PGA) may be interposed between the pixel circuits (PIX_BLK) 93 and the ADC 70. The ADC 70 may be any ADC such as a parallel processing type ADC with a plurality of units or a single pipeline type ADC. Some processing blocks and a data mapping unit are provided between the ADC 70 and the LVDS 71, which are omitted in FIG. 16.

Note that the image processing apparatus of the embodiments has been described as applied to an MFP having at least two of copying, printing, scanning, and facsimile functions. Alternatively, the image processing apparatus of the embodiments may be applied to, e.g., a copier, a printer, a scanner, or a facsimile machine.

In addition, the reading device or the image processing apparatus of the embodiments has been described as applied to, but not limited to, an MFP. For example, the reading device or the image processing apparatus of the embodiments may be applied to applications in various fields, such as inspection in a factory automation (FA) field.

The reading device or the image processing apparatus of the embodiments may be applied to a bill scanner that is used to discriminate bills and prevent the forgery.

The above-described embodiments are illustrative and do not limit the present invention. Thus, numerous additional modifications and variations are possible in light of the above teachings. For example, elements and/or features of different illustrative embodiments may be combined with each other and/or substituted for each other within the scope of the present invention.

This patent application is based on and claims priority to Japanese Patent Application No. 2019-180197, filed on Sep. 30, 2019, in the Japan Patent Office, the entire disclosure of which is hereby incorporated by reference herein.

REFERENCE SIGNS LIST

2 Light source
9 Photoelectric conversion element
26 Invisible component removing unit
70 AD converter
80 Shield line
90R Third pixel array
90G First pixel array
90B Fourth pixel array
90IR Second pixel array
90dummy Dummy pixel array
91R, 91G, 91B, 91IR Color filters
92 First pixel, Second pixel, Third pixel, Fourth pixel
93 First pixel circuit, Second pixel circuit, Third pixel circuit, Fourth pixel circuit
94R Third light-receiving section
94G First light-receiving section
94B Fourth light-receiving section
94IR Second light-receiving section
100 Image processing apparatus
101 Image reading device
103 Image forming unit

The invention claimed is:

1. A photoelectric conversion element comprising:
a first pixel array including first light-receiving sections arranged in a direction,
each of the first light-receiving sections including:
a first pixel configured to receive at least light having a first wavelength inside a visible spectrum; and
a first pixel circuit configured to transmit a signal from the first pixel to a subsequent stage; and
a second pixel army including second light-receiving sections arranged in the direction,
each of the second light-receiving sections including:
a second pixel configured to receive at least light having a second wavelength outside the visible spectrum; and
a second pixel circuit configured to transmit a signal from the second pixel to the subsequent stage,
the second pixel circuit provided in an adjacent area of the second pixel: and
a dummy pixel array configured to imitate a pixel array and a pixel circuit at an end portion of a sensing area including at least the second pixel array.

2. The photoelectric conversion element according to claim 1, wherein:
the first pixel circuit is provided in an adjacent area of the first pixel.

3. The photoelectric conversion element according to claim 1, further comprising:
a third pixel array including third light-receiving sections arranged in the direction,
each of the third light-receiving sections including:
a third pixel configured to receive at least light having a third wavelength inside the visible spectrum different from the first wavelength; and
a third pixel circuit provided in an adjacent area of the third pixel and configured to transmit a signal from the third pixel to the subsequent stage; and a fourth pixel array including fourth light-receiving sections arranged in the direction,
each of the fourth light-receiving sections including:
a fourth pixel configured to receive at least light having a fourth wavelength inside the visible spectrum different from the first wavelength and the third wavelength; and
a fourth pixel circuit provided in an adjacent area of the fourth pixel and configured to transmit a signal from the fourth pixel to the subsequent stage.

4. The photoelectric conversion element according to claim 3, further comprising:
an output line of the first pixel circuit;
an output line of the second pixel circuit;
an output line of the third pixel circuit; and
an output line of the fourth pixel circuit,
wherein an interval between the output line of the second pixel circuit and the output line of one of the first pixel circuit, the third pixel circuit, and the fourth pixel circuit, the output line of the one being adjacent to the output line of the second pixel circuit, is longer than a distance between adjacent ones of the output line of the first pixel circuit, the output line of the third pixel circuit, and the output line of the fourth pixel circuit.

5. The photoelectric conversion element according to claim 3, wherein:
one of the first pixel array, the third pixel array, and the fourth pixel array is configured to receive the light having the second wavelength.

6. The photoelectric conversion element according to claim 3, wherein:
the first pixel array, the second pixel array, the third pixel array, and the fourth pixel array include color filters, respectively, identical in number of layers.

7. The photoelectric conversion element according to claim 3, wherein:
an interval between the second pixel array and one, adjacent to the second pixel array, of pixel arrays each configured to receive light having a wavelength in the visible spectrum other than the second pixel array is longer than a distance between adjacent ones of the pixel arrays each configured to receive the light having the wavelength in the visible spectrum other than the second pixel array.

8. The photoelectric conversion element according to claim 1, further comprising:
shield lines arranged on both sides across an output line of the second pixel circuit.

9. The photoelectric conversion element according to claim 8, wherein the shield lines are low impedance lines.

10. The photoelectric conversion element according to claim 8, wherein the shield lines are a power supply line and a ground line.

11. The photoelectric conversion element according to claim 1, wherein:
the second pixel array is configured to receive infrared light.

12. The photoelectric conversion element according to claim 1, wherein:
an interval between the second pixel array and a pixel array configured to receive light having a wavelength in the visible spectrum other than the second pixel array is an integer multiple of a physical distance with a sub-scanning pixel width as a unit.

13. The photoelectric conversion element according to claim 1, wherein:

the second pixel array and the pixel array configured to receive the light having the wavelength in the visible spectrum other than the second pixel array have identical physical structures.

14. A reading device comprising:
a light source configured to emit visible light and invisible light; and
the photoelectric conversion element according to claim 1, configured to receive reflected light of the visible light and the invisible light emitted from the light source.

15. An image processing apparatus comprising:
the reading device according to claim 14, configured to read image data; and
an image former configured to form an image according to the image data.

* * * * *